United States Patent
Takeuchi et al.

(10) Patent No.: US 6,268,017 B1
(45) Date of Patent: Jul. 31, 2001

(54) METHOD FOR PROVIDING A PARTIAL PLATING

(75) Inventors: Masayuki Takeuchi; Katsumasa Yoshinari; Kazuyiki Futaki; Kouji Nishimura; Yoshinobu Miyanoo, all of Tokyo; Ryoji Arai; Nobuyuki Takei, both of Nagano, all of (JP)

(73) Assignee: Fujitsu Takamisawa Component Limited, Tokyo (JP)

(*) Notice: Subject to any disclaimer, the term of this patent is extended or adjusted under 35 U.S.C. 154(b) by 0 days.

(21) Appl. No.: 09/352,354

(22) Filed: Jul. 13, 1999

(30) Foreign Application Priority Data

Jul. 15, 1998 (JP) .................................................. 10-240993
Oct. 16, 1998 (JP) .................................................. 10-295748

(51) Int. Cl.⁷ .............................. B05D 3/10; B05D 1/36; B05D 1/32
(52) U.S. Cl. .................... 427/125; 427/156; 427/264; 427/272; 427/273; 427/282; 427/343; 427/405; 427/435; 205/135; 205/223
(58) Field of Search ..................................... 427/125, 261, 427/264, 272, 273, 282, 287, 343, 405, 159, 156, 435; 205/135, 136, 221, 223, 718; 451/29, 36

(56) References Cited

U.S. PATENT DOCUMENTS 4,539,839 * 9/1985 Horiguchi et al. ...................... 73/73
4,946,711 * 8/1990 Hawker et al. ....................... 427/156
5,486,135 * 1/1996 Arpaio ................................. 451/326
5,580,432 * 12/1996 Shibata et al. .................. 204/297 R

FOREIGN PATENT DOCUMENTS

2105749 * 3/1983 (GB) .
62-113457 * 5/1987 (JP) .

* cited by examiner

*Primary Examiner*—Shrive Beck
*Assistant Examiner*—Michael Barr
(74) *Attorney, Agent, or Firm*—Staas & Halsey LLP

(57) ABSTRACT

A method for providing a partial plating to a lead pin, comprising the steps of plating an entire surface of the lead pin; covering a first part of a plated surface of the lead pin by a gel member; and subjecting a second part of the plated surface of the lead pin, which extends out of the gel member, to a metal-coating removing agent, to remove a metal coating of the second part of the plated surface. The plating step may include providing a composite plating on the entire surface of the lead pin, and the subjecting step may include removing an uppermost metal layer of the composite plating by the metal-coating removing agent. The composite plating may include a nickel base layer and a gold uppermost layer deposited on the nickel base layer. The gel member may be formed from a non-oily clay or paper-mache for handcraft use.

34 Claims, 7 Drawing Sheets

METHOD FOR PROVIDING A PARTIAL PLATING

BACKGROUND OF THE INVENTION

1. Field of the Invention

The present invention relates to a plating process and, more particularly, to a method for providing a partial plating onto a relatively small article such as a lead pin capable of being used for electronic devices.

2. Description of the Related Art

Conventionally, a lead pin adapted to be incorporated in an electronic device, such as a semiconductor package, is plated over the entire surface of the lead pin. Various characteristics or performances are usually required for such a lead pin, so that it has been a general practice to provide a composite or multilayer plating onto the lead pin, which is formed by stacking various metal coatings one on top of the other. One of the typical conventional composite platings is a gold plating including a nickel base layer and a gold uppermost layer deposited on the nickel base layer.

The lead pin, the entire surface of which is coated with the gold plating including the nickel base layer, can be suitably used and incorporated in a semiconductor package named "a multichip module" in which plural semiconductor chips are mounted on a single substrate. In the multichip module, the lead pin is normally fixed at one end thereof to the surface of the module substrate by a gold/tin alloy solder (an Au/Sn solder).

The multichip module is adapted to be mounted on the surface of a circuit board through numbers of lead pins arranged in an array. When maintenance, such as chip replacement, is required for the multichip module, an operator usually performs the maintenance to a multichip module fully disengaged from the circuit board.

To facilitate such a disengagement of the module from the circuit board, each lead pin is generally connected at an end thereof, opposite to the fixed end on the substrate, to the circuit board through a tin/lead alloy solder (an Sn/Pb solder), the melting point of which is lower than that of the Au/Sn solder. In this structure, the lead pins are heated to melt only the Sn/Pb solder, which permits the module to be readily disengaged from the circuit board.

When the Sn/Pb solder for connecting each lead pin to the circuit board is molten, the molten Sn/Pb solder may flow on the gold plated surface of the lead pin to reach the Au/Sn solder for connecting the lead pin to the module substrate. Therefore, if one multichip module is repeatedly disengaged from and mounted to the circuit board during maintenance, the melting point of the Au/Sn solder may be lowered due to the mixing of a gold/tin alloy and a tin/lead alloy. When the melting point of the Au/Sn solder is lowered, not only the Sn/Pb solder but also the Au/Sn solder are molten during subsequent maintenance work, which may cause the lead pin to fall off from the module substrate.

To solve the problem of the falling-off of the lead pin, it may be beneficial to provide means for impeding the flow of the molten Sn/Pb solder to a gold plated portion defined between the solders on the opposed ends of the lead pin. Such means may be effectively structured by forming an annular exposed region having no gold uppermost layer, such as a nickel base-layer surface region or a lead-pin material surface region, over a predetermined length on the gold plated portion between the solders. In general, a nickel base-layer surface or a lead-pin material surface is more readily oxidized in comparison with the gold plated surface and is thereby provided with less wetability for solder, so that the flow of the molten Sn/Pb solder can be impeded at the annular surface region of the nickel base-layer or the lead-pin material.

Both the annular nickel base-layer surface region and the annular lead-pin material surface region may be formed by completing a gold plating process only in the opposed end regions of the lead pin, or by sanding the surface of the gold plated portion between the solders of the opposed ends to partially remove the uppermost gold layer after completion of the gold plating process. However, these processes are difficult to precisely perform on a minute lead pin, such as the lead pin of the multichip module, and also be unsatisfactory for mass production of the lead pin.

SUMMARY OF THE INVENTION

It is, therefore, an object of the present invention to provide a method for precisely providing a partial plating to a desired location on the surface of a minute article.

It is another object of the present invention to provide a partial plating method satisfying mass production of a lead pin of an electronic device.

In order to accomplish the above objects, the present invention provides a method for providing a partial plating to an article, comprising the steps of plating an entire surface of the article; covering a first part of a plated surface of the article by a gel material or member; and subjecting a second part of the plated surface of the article, which extends out of the gel member, to a metal-coating removing agent, to remove a metal coating of the second part of the plated surface.

In the above method, the plating step may include providing a composite plating on the entire surface of the article, and the subjecting step may include removing an uppermost metal layer of the composite plating by the metal-coating removing agent.

Also, the gel member may be formed from a non-oily clay or paper-mache.

The present invention also provides a method for providing partial plating to a lead pin, comprising the steps of plating an entire surface of the lead pin; covering a first part of a plated surface of the lead pin by a gel member; and subjecting a second part of the plated surface of the lead pin, which extends out of the gel member, to a metal-coating removing agent, to remove a metal coating of the second part of the plated surface.

In the above method, the plating step may include providing a composite plating on the entire surface of the lead pin, and the subjecting step may include removing an uppermost metal layer of the composite plating by the metal-coating removing agent.

The composite plating may include a nickel base layer and a gold uppermost layer deposited on the nickel base layer.

The method may further comprise the step of forming a bulging portion at one end region of the plated surface of the lead pin, wherein the bulging portion is supported during the subjecting step to embed the first part into the gel member.

The bulging portion may be formed of a solder ball.

The method may be adapted to simultaneously provide partial platings to a plurality of lead pins, and may further comprise the step of providing a support plate including plural through holes for respectively receiving the plurality of lead pins, the bulging portion of each of the lead pins being supported on an edge of the support plate defining each of the through holes.

The support plate may be treated with a water-repellent finishing, and the subjecting step may include removing the metal coating of the second part of each of the lead pins located between the support plate and the gel member.

The water-repellent finishing may comprise a nickel plating containing polytetrafluoroethylene particles.

The method may further comprise the step of subjecting the lead pin to vibration while subjecting the second part of the plated surface of the lead pin to the metal-coating removing agent.

BRIEF DESCRIPTION OF THE DRAWINGS

The above and other objects, features and advantages of the present invention will become more apparent from the following description of preferred embodiments in connection with the accompanying drawings, in which.

DETAILED DESCRIPTION OF THE PREFERRED EMBODIMENTS

Figure 1:
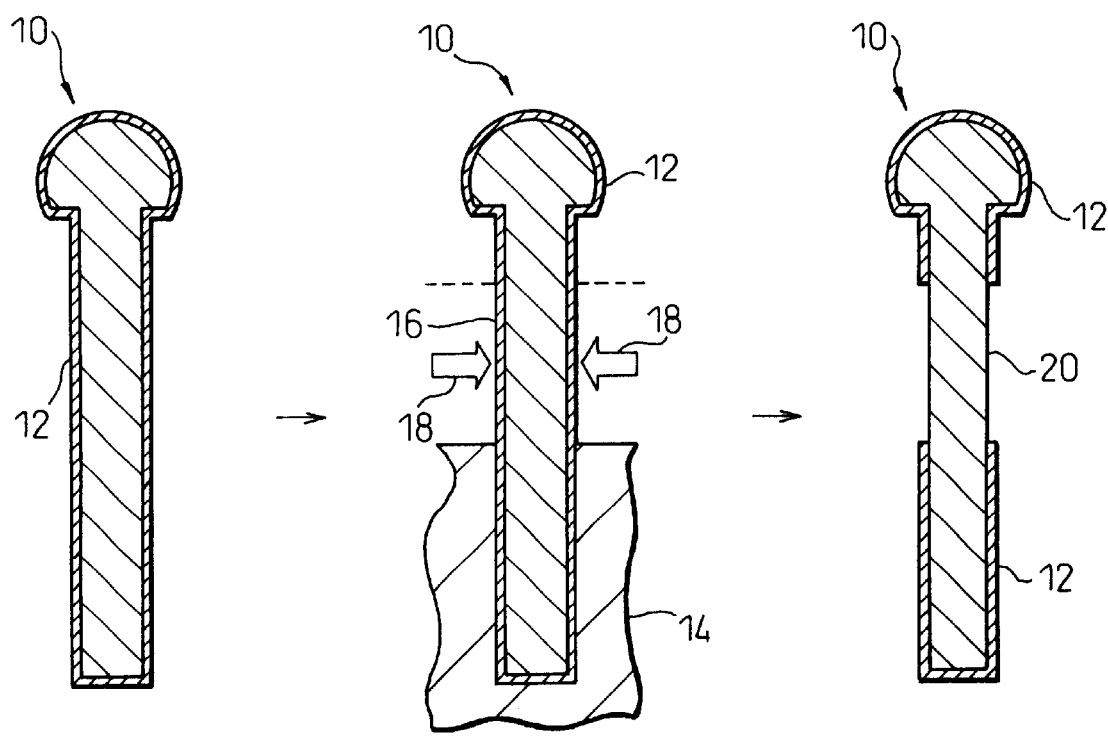
FIG. 1 diagrammatically shows a method for providing a partial plating, according to the present invention.

Referring now to the drawings, wherein the same or similar components are designated by the common reference numerals, FIG. 1 diagrammatically shows a method for providing a partial plating, according to the present invention, onto the surface of an article, or of a lead pin by way of example.

As shown in FIG. 1, a lead pin 10 is first plated on the entire surface thereof to form a metal coating 12 thereon. Next, a first part or one end of the entirely plated surface of the lead pin 10 is covered with a gel member 14. During this condition, a second part of the plated surface or a desired plated surface portion 16 of the lead pin 10, which extends out of the gel member 14, is subjected to a metal-coating removing agent 18, so as to remove the local portion of the metal coating 12, i.e., the metal coating 12 only in the plated surface portion 16. In this manner, plated surface portions made of the metal coatings 12 are formed at desired locations on the surface of the lead pin 10 (at the opposite end regions of the lead pin 10 in the drawing). Between the plated surface portions of the metal coatings 12, an annular or cylindrical lead-pin material surface 20 of the lead pin 10 is exposed.

In this method, when the lead pin 10 is first plated with a composite or multilayer plating, only an uppermost layer made of the metal coating 12 is removed by using the metal-coating removing agent 18 suitable for the uppermost metal coating 12. Thereby, the plated surface portions made of the metal coatings 12 are formed at the opposite end regions of the lead pin 10, and an annular or cylindrical lower- or base-layer surface 20 is exposed between the plated surface portions.

Figure 2A:
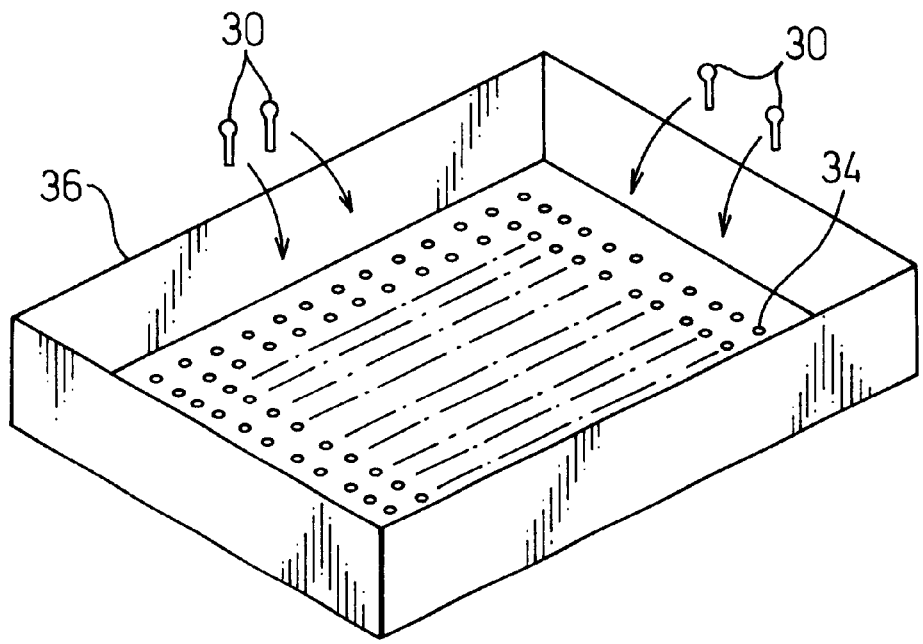
FIG. 2A is a perspective view of a support plate which can be used for carrying out the partial plating method according to an embodiment of the present invention.
Figure 2B:
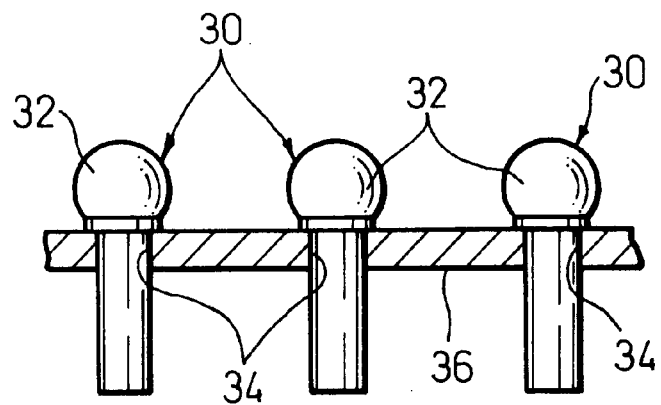
FIG. 2B is an enlarged sectional view of a part of the support plate, shown in FIG. 2A, with lead pins supported thereon.

FIGS. 2A to 4 show a plating equipment for carrying out the method for providing a partial plating to the desired location on the lead pin, according to an embodiment of the present invention. In this embodiment, each of plural lead pins 30 is first plated on the entire surface thereof with a composite plating including a nickel base layer and a gold uppermost layer deposited on the nickel base layer. A solder ball 32 made of a gold/tin alloy solder (an Au/Sn solder) is attached to one end of each lead pin 30 (FIG. 2B). Then, a support plate 36 is provided, which includes a plurality of through holes 34 distributed over the bottom area of the support plate 36, and the plural lead pins 30 are placed on the support plate 36 (FIG. 2A). Next, the support plate 36 is subjected to vibration, so that the lead pins 30 are automatically inserted, along the ends opposite to the solder balls 32, into the respective through holes 34 of the support plate 36. In this state, each lead pin 30 is held in a generally vertical position in each through hole 34 under the interengagement between the solder ball 32 and the edge defining the through hole 34 (FIG. 2B).

The support plate 36 may be made of metal, such as a stainless steel, or a desired plastic. It is preferred that the support plate 36 has such a rigidity as to substantially prevent the support plate 36 from being bent due to the weight of the lead pins 30 supported thereon, in order to ensure that the desired plated surface portions are precisely formed at desired locations on the respective lead pins 30. Also, in the similar reason, it is advantageous to provide a water repellent finish to the surface of each lead pin 30, as described later.

Figure 3A:
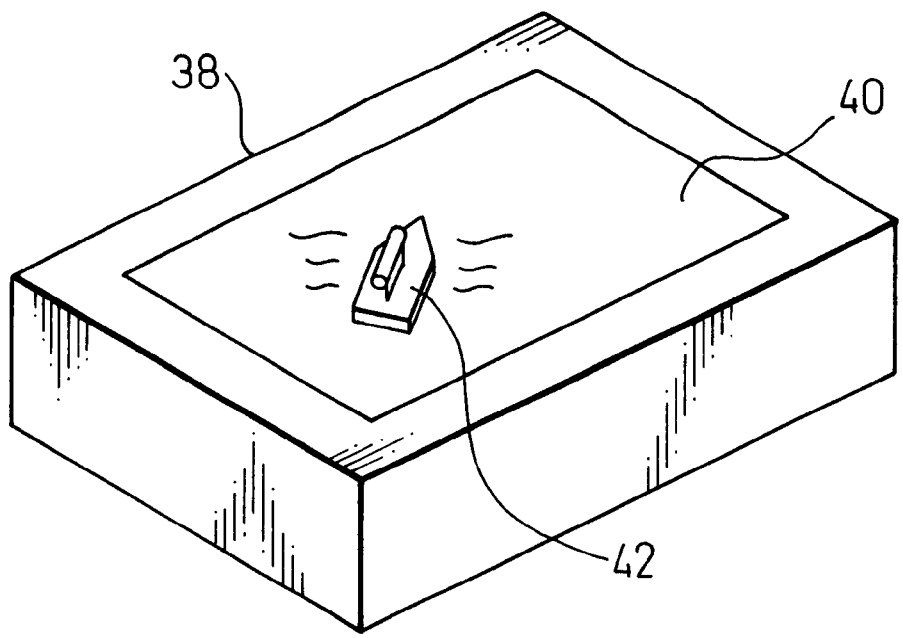
FIG. 3A is a perspective view of a vessel and a gel member contained therein, which can be used for carrying out the partial plating method.
Figure 3B:
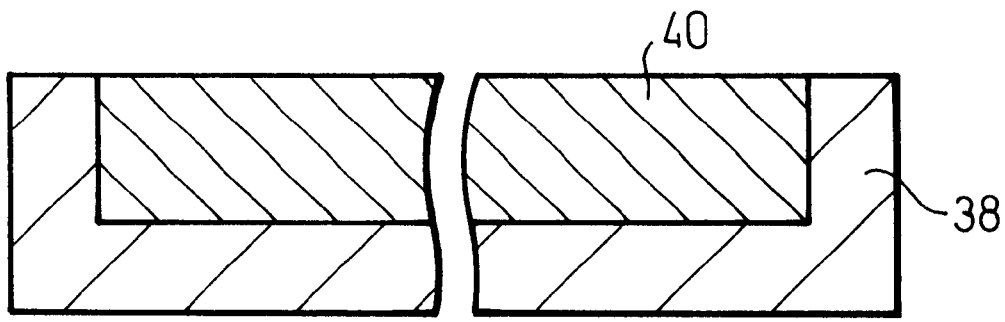
FIG. 3B is an enlarged sectional view of the vessel and the gel member, shown in FIG. 3A.

On the other hand, a vessel 38 with an open upper end is provided, and is filled with a gel member 40, the top surface of which is averaged by a pallet 42 (FIGS. 3A and 3B). The gel member 40 may be made of various materials assuming gel properties, such as an agar, a konnyaku, a clay, and so on. In particular, non-oily materials or materials with less permeability to liquid (or to a metal-coating removing agent) are advantageously used for the gel member 40.

Figure 4:
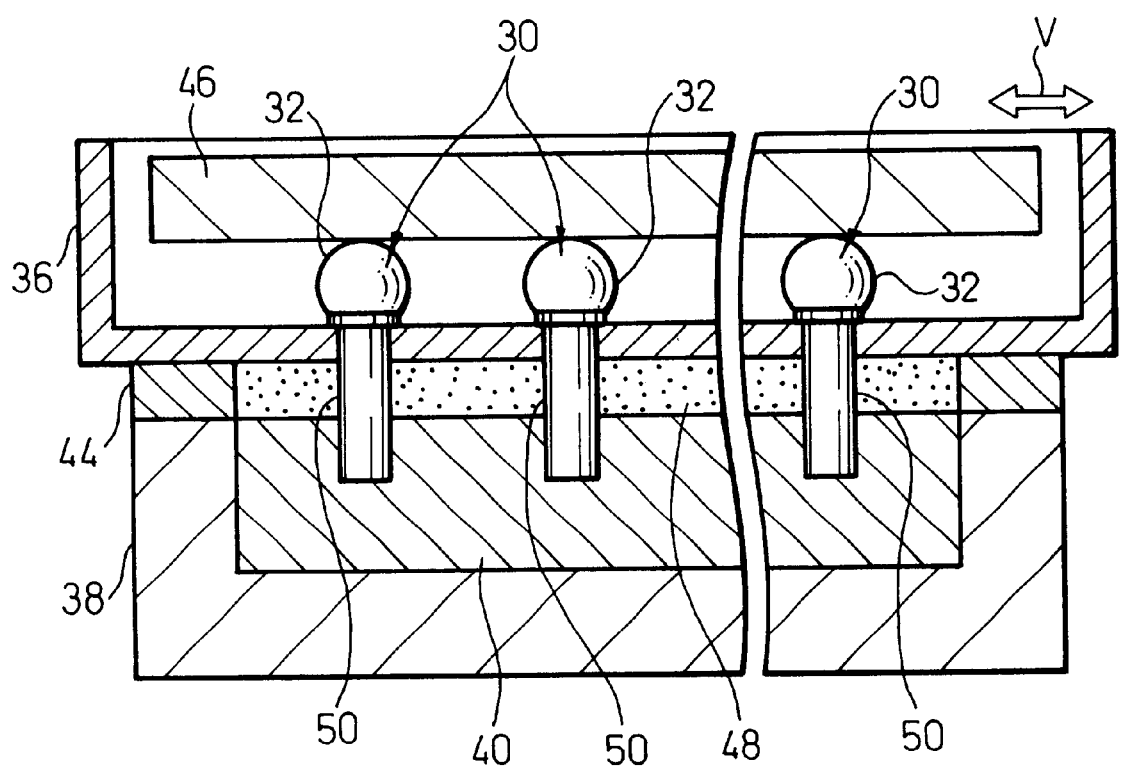
FIG. 4 is an enlarged sectional view showing a part of a plating equipment for carrying out the partial plating method.

Then, the support plate 36 supporting the lead pins 30 thereon is placed on the top of the vessel 38 through a spacer 44 disposed therebetween. In this step, a presser plate 46 is put on the solder balls 32 of the lead pins 30 to weigh them down, whereby the tip ends of the lead pins 30 are embedded into the gel member 40 while preventing the lead pins 30 from being raised (FIG. 4). The distance between the bottom face of the support plate 36 and the top face of the gel member 40 corresponds to a length of the gold uppermost layer to be removed in each lead pin 30, and depends on the thickness of the spacer 44.

In this condition, a metal-coating removing liquid agent 48, suitable for removing a gold coating, is introduced into a space defined between the support plate 36 and the gel member 40, so as to affect the gold-plated surface portions 50 of the lead pins 30, which are located within the space, and to remove the local portions of the gold uppermost layers. In this step, it is preferred that the support plate 36 is subjected to vibration (shown by an arrow V) while keeping the gold-plated surface portions 50 of the lead pins 30 dipped in the metal-coating removing agent 48. Thereby, it is possible to remove the gold uppermost layers while eliminating bubbles or local air accumulations in the metal-coating removing agent 48.

Figure 5:
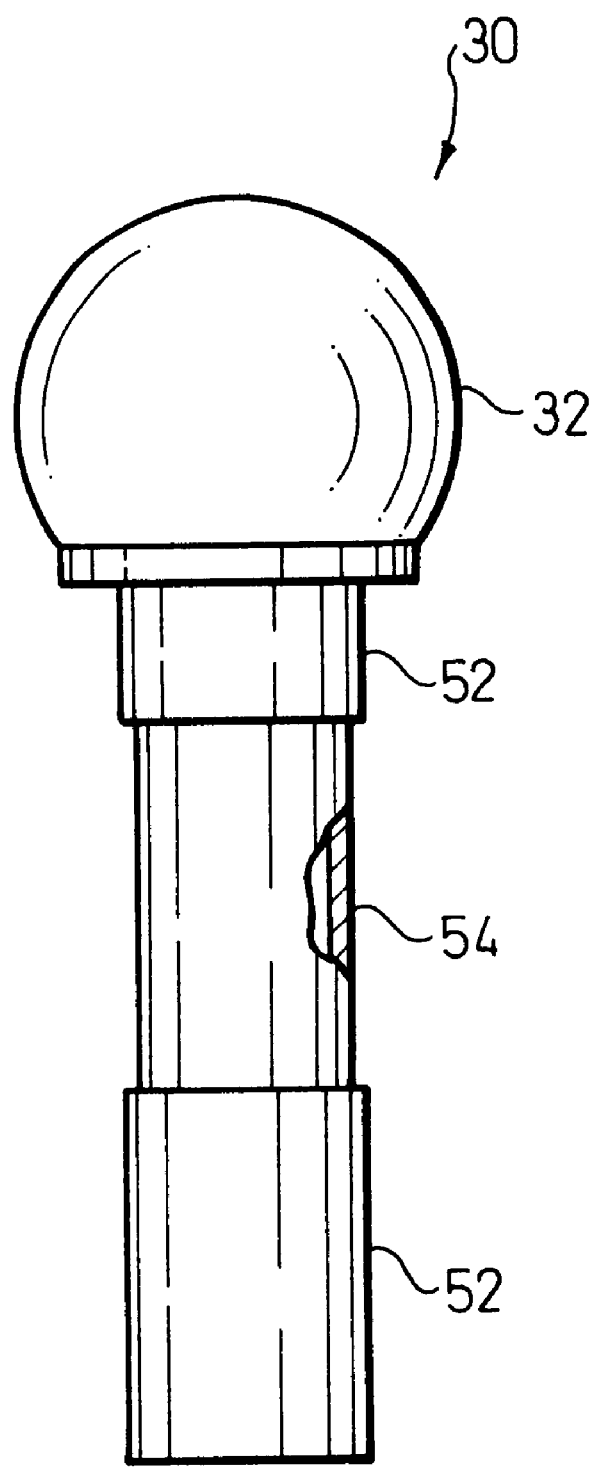
FIG. 5 is an enlarged front view of a lead pin processed by the plating equipment shown in FIG. 4.

In this manner, as shown in FIG. 5, plated surface portions, i.e., annular or cylindrical gold plated surfaces 52 are formed at a region adjacent to the solder ball 32 and an opposed tip-end region away from the solder ball 32. Also, an annular or cylindrical nickel base-layer surface 54 is correctly exposed at a desired position between the gold plated surfaces 52.

Figure 6A:
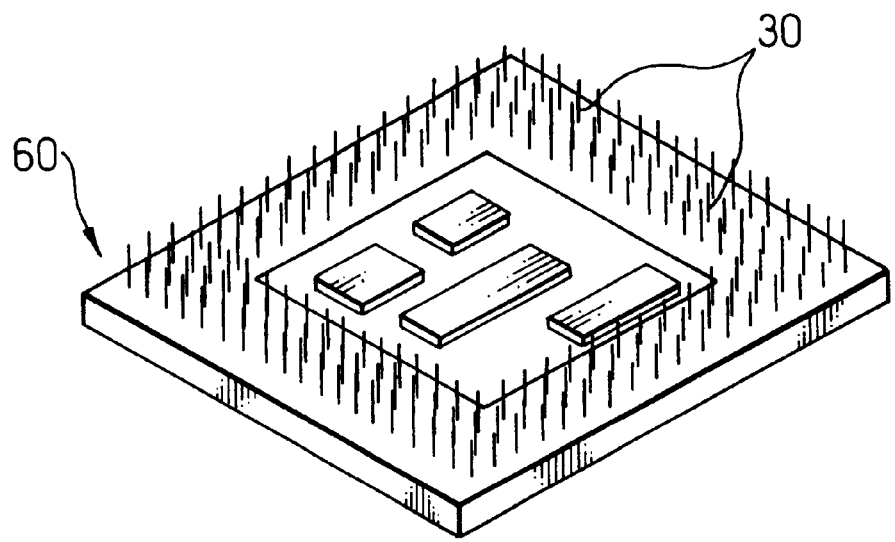
FIG. 6A is a schematic perspective view of a multichip module into which the lead pins formed by the method according to the present invention can be incorporated.
Figure 6B:
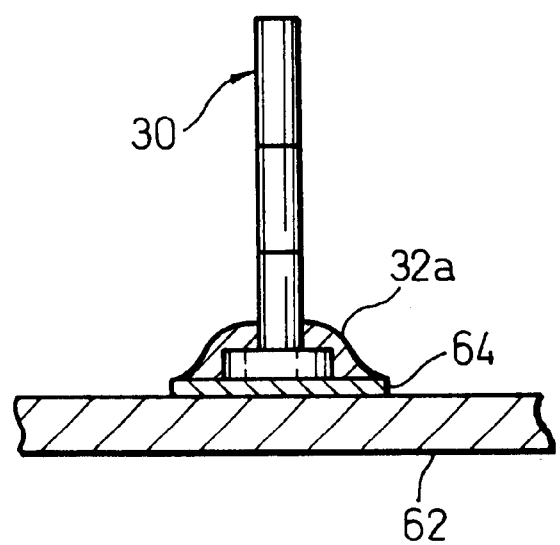
FIG. 6B is a partially enlarged sectional view of he multichip module shown in FIG. 6A.
Figure 7:
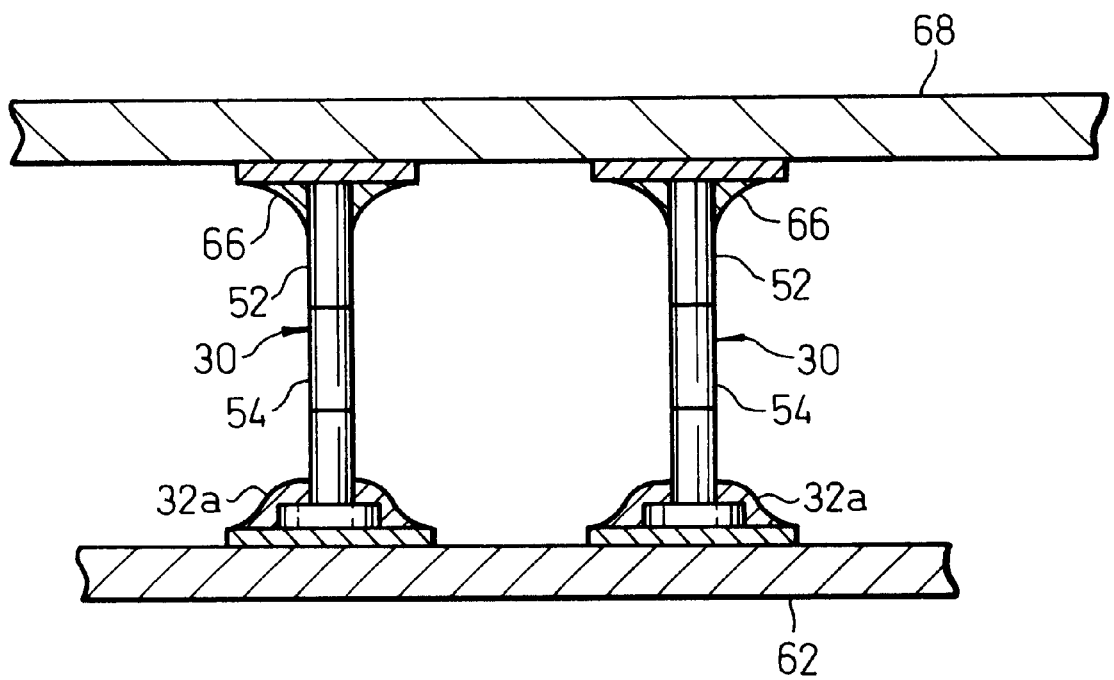
FIG. 7 is a partially enlarged sectional view of the multichip module illustrated in a condition mounted on a circuit board.

The lead pin 30 having thus a locally exposed nickel base-layer surface 54 can be effectively used as one of numbers of lead pins vertically or uprightly mounted and arranged in an array on a multichip module 60 illustrated by way of example in FIGS. 6A and 6B. In this arrangement, each of the lead pins 30 is fixed to a module substrate 62 of the multichip module 60 through a fillet 32a (or the solder ball 32 after melting) of the Au/Sn solder. On the other hand, as shown in FIG. 7, the multichip module 60 is mounted on the surface of a circuit board 68 through tin/lead alloy solders (Sn/Pb solders) 66 applied on the gold plated surfaces 52 at the tip ends of the lead pins 30.

When the multichip module 60 is disengaged from the circuit board 68 for maintenance, heat required to melt only the Sn/Pb solders 66 is applied to the lead pins 30 through, e.g., the circuit board 68. During this step, a molten tin/lead alloy can be hindered from flowing along each lead pin 30 in an axial direction due to the nickel base-layer surface 54 with low wetability for solder. As a result, it is possible to prevent the melting point of the Au/Sn fillet 32a for connecting the lead pin 30 to the module substrate 62 from being lowered due to the mixing of a gold/tin alloy and a tin/lead alloy. Therefore, even if maintenance is performed several times on the multichip module 60, the lead pins 30 are effectively prevented from falling out from the module substrate 62.

In the above embodiment, the metal coating of an intermediate metal-plated portion of the minute lead pin is removed. However, it is also possible to remove the metal coating of a larger metal-plated portion including the intermediate portion and the end region corresponding to the solder ball 32, through the above-mentioned steps wherein the other tip end of the lead pin is embedded into and masked by the gel member. Also in the above embodiment, the uppermost gold layer of the composite plating is removed. However, according to the present invention, it is possible to remove the metal coating of a single-layer plating, or the metal coating other than gold, such as palladium, tin, indium, silver-tin-indium, and so on, by using the metal-coating removing agent suitable for removing every one of those metals.

The inventors performed some experiments in relation to the present invention. The results of those experiments are described below.

In general, a lead pin for a multichip module is produced to have a diameter of 0.2 to 0.5 mm and a length of 3 to 10 mm, with a solder ball having a diameter of 0.4 to 0.7 mm being attached to one end thereof. Also, a composite plating, including a nickel base layer 1 to 3 µm in thickness and a gold uppermost layer approximately 1 µm in thickness, is generally provided on the surface of the lead pin. The lead pins used in the experiments described below were adaptable to these conditions.

Experiment 1

About five thousand lead pins were simultaneously processed by the plating equipment as shown in FIG. 4, to remove the gold-plated surface portion of each lead pin defined at a desired location. The particulars of the equipment and the condition for gold removing were as follows:

Equipment particulars:
  a support plate . . . a stainless steel plate having 170 mm length (L)×200 mm width (W)×0.3 mm thickness (T), with the number of 5412 through holes having about 0.33 mm diameter (D) formed by an etching process;
  a gel member . . . an oily clay for handcraft use ("Debika Abura Nendo (trade name)", R. K. Yamato, Japan);

Gold Peeling Condition:
  a removing liquid agent . . . a mixture of 1 liter undiluted "Ohro Stripper (trade name)" (Nisshin Kasei K. K., Japan) and 10 liters of water;
  temperature of the removing agent . . . 40° C.; and
  time required for removing . . . 60 to 90 sec.

As a result of the experiment, the lead pins 30 were produced, each shown in FIG. 5. However, an oil ingredient of the oily clay oozed to flow along the gold plated surface of each lead pin, and thereby a local portion, where the gold uppermost layer was not removed, was left on the lead pin.

Experiment 2

The particulars of the equipment and the condition for gold removing were substantially identical to those of the experiment 1, except for a selection of a gel member made of a non-oily clay as follows:

a gel member . . . a non-oily clay or paper-mache for handcraft use, containing thermal expansive microcapsules ("Karui Kami Nendo (trade name)", Sunstar Bungu K. K., Japan).

As a result of the experiment, an oozing oil ingredient was eliminated, but the removing liquid agent permeated into the gel member because of the non-oily properties of the latter, and thereby the gold uppermost layer, at the tip end region of the lead pin was partially removed. Also, the removing liquid agent permeated into a clearance between the lead pin and the support plate, whereby the boundary of the removed or exposed portion adjacent to the solder ball was unevenly formed between one and the other lead pins.

Experiment 3

The particulars of the equipment and the condition for gold removing were substantially identical to those of the experiment 1, except for a selection of a gel member made of a non-oily clay as follows:

a gel member . . . a clay-like material made from wheat flour kneaded with water.

As a result of the experiment, the gel material was readily softened into an over-moist state by the removing liquid agent. Thereby, the partial removing of the gold uppermost layer was insufficiently performed.

As described above, it was found from the experiments 1 to 3 that the oily gel member has a durability against the removing liquid agent, but has a problem of oil-contamination in which an oil ingredient oozes to flow along the lead pin, while the non-oily gel member tends to be readily moisturized and affected by the removing liquid agent. In practice, the water resistance and the oil resistance of the gel member are essentially inconsistent with each other. However, the inventors regarded the oil resistance as of first important on this matter, and conceived using a special non-oily clay or paper-mache for handcraft use as described below (Experiment 4). This special paper-mache is made by adding aqueous solution of synthetic adhesive paste with high viscosity, such as polyvinyl alcohol or carboxymethyl cellulose (CMC), to pulp as a main component, and kneading this mixture. The paper-mache, which is well kneaded up to a suitable consistency sufficient to prevent the permeation of the removing liquid agent, can effectively act as the gel member to cover the tip end region of the lead pin and to protect it from the removing liquid agent.

Experiment 4

The particulars of the equipment and the condition for gold removing were substantially identical to those of the experiment 1, except for selections of a gel member as a paper-mache and of a water-repellent finished support plate, as follows:

a water-repellent finishing for a support plate Nickel electroless plating containing 23% polytetrafluoroethylene particles ("Nimfreon (trade name)", Uemura Kogyo K. K., Japan); and a gel member . . . a non-oily clay or paper-mache for handcraft use ("Kororin-yama-no-nakayoshi-tai (trade name)", K. K. Yamato, Japan).

The water-repellent finished support plate made it possible to prevent the removing liquid agent from permeating into the clearance between the lead pins and the support plate, and thereby equalized the boundary of the removed or exposed portion adjacent to the solder ball. Also, the paper-mache used as the gel member made it possible to eliminate the oil-contamination of the lead pins, and thereby uniformly remove the intermediate portions of the lead pins. Due to the relatively short time (60 to 90 sec.) required for the removing, the permeation of the removing liquid agent into the paper-mache was effectively prevented, and thereby it substantially fully protected the tip end regions of the lead pins.

As will be understood from the above description, the method of the present invention makes it possible to precisely provide a partial plating(s) to a desired location(s) on the surface of a minute article, such as a lead pin of an electronic device. When using the support plate for supporting plural lead pins, it is also possible to satisfy mass production of a lead pin. When applying the invention for the production of the lead pin used for a multichip module, it is possible to provide the multichip module with high reliability where the lead pins hardly fall out from the module substrate for repated maintenance.

While the invention has been particularly shown and described with reference to preferred embodiments thereof, it will be understood by those skilled in the art that various changes and modifications may be made without departing from the spirit and scope of the following claims.

What is claimed is:

1. A method for providing partial of a plurality of articles, comprising the step of:

plating an entire surface of each of the plurality of articles;

simultaneously covering an entire first part of a plated surface of the plurality of articles directly by a gelatinous material by immersing the respective first parts in a supply of the gelatinous material; and while maintaining the gelatinous material in a gelatinous state, and while maintaining the entire first part covered by the gelatinous material, subjecting a second part of the plated surface of the plurality of articles, which is not covered by said gelatinous material, to a metal-coating removing agent, to remove a metal coating of the second part of the plated surface.

2. The method of claim 1, wherein said plating step includes providing a composite plating on the entire surface of the article, and wherein said subjecting step includes removing an uppermost metal layer of said composite plating by said metal-coating removing agent.

3. The method of claim 1, wherein said gelatinous material is formed from a non-oily clay or paper-mache.

4. A method for providing partial plating to a plurality of lead pins, comprising the steps of:

plating an entire surface of each of the plurality of the lead pins;

simultaneously covering an entire first part of a plated surface of the plurality of lead pins directly by a gelatinous material by immersing the respective first parts in a supply of the gelatinous material; and while maintaining the gelatinous material in a gelatinous state, and while maintaining the first part covered by the gelatinous material, subjecting a second part of the plated surface of each lead pin, which extends out of said gelatinous material to a metal-coating removing agent, to remove the metal coating of the second part of the plated surface.

5. The method of claim 4, wherein said plating step includes providing a composite plating on the entire surface of the lead pin, and wherein said subjecting step includes removing an uppermost metal layer of said composite plating by said metal-coating removing agent.

6. The method of claim 5, wherein said composite plating includes a nickel base layer and a gold uppermost layer deposited on the nickel base layer.

7. The method of claim 4, further comprising the step of forming a bulging portion at one end region of the plated surface of the lead pin, wherein said bulging portion is supported during said subjecting step to embed the first part into said gelatinous material.

8. The method of claim 7, wherein said bulging portion is formed of a solder ball.

9. The method of claim 7, adapted to simultaneously provide partial platings to a plurality of lead pins, and further comprising the step of providing a support plate including plural through holes for respectively receiving said plurality of lead pins, said bulging portion of each of said lead pins is supported on an edge of said support plate defining each of said through holes.

10. The method of claim 9, wherein said support plate is treated with a water-repellent finishing, and wherein said subjecting step includes removing said metal coating of said second part of each of said lead pins located between said support plate and said gelatinous material.

11. The method of claim 10, wherein said water-repellent finishing comprises a nickel plating containing polytetrafluoroethylene particles.

12. The method of claim 4, further comprising the step of subjecting the lead pin to vibration while keeping the second part of the plated surface of the lead pin being subjected to said metal-coating removing agent.

13. A method for providing a partial plating to an articles, comprising the step of:

plating an entire surface of the articles;

simultaneously covering an entire first part of a plated surface of the article directly by a gelatinous material by immersing the first part in a supply of the gelatinous material; and while maintaining the gelatinous material in a gelatinous state, and while maintaining the entire first part covered by the gelatinous material, subjecting a second part of the plated surface of the articles, which extends out of said gelatinous material, to a metal-coating removing agent, to remove the metal coating of the second part of the plated surface, wherein said gelatinous material is formed from paper-mache.

14. A method for providing a partial plating to a lead pin, comprising the steps of:

plating an entire surface of the lead pin;

covering a first part of a plated surface of the lead pin by a gelatinous material; and subjecting a second part of the plated surface of the lead pin, which extends out of said gelatinous material, to a metal-coating removing agent, to remove a metal coating of the second part of the plated surface; and forming a bulging portion at one end region of the plated surface of the lead pin, wherein said bulging portion is supported during said subjecting step to embed the first part into said gelatinous material.

15. The method of claim 14, wherein said bulging portion is formed of a solder ball.

16. The method of claim 14, adapted to simultaneously provide partial platings to a plurality of lead pins, and further comprising the step of providing a support plate including plural through holes for respectively receiving said plurality of lead pins, said bulging portion of each of said lead pins is supported on an edge of said support plate defining each of said through holes.

17. The method of claim 14, wherein said support plate is treated with a water-repellent finishing, and wherein said subjecting step includes removing said metal-coating of said second part of each of said lead pins located between said support plate and said gelatinous material.

18. The method of claim 17, wherein said water-repellent finishing comprises a nickel plating containing polytetrafluoroethylene particles.

19. The method of claim 13, wherein said plating step includes providing a composite plating on the entire surface of the article, and wherein said subjecting step includes removing an uppermost metal layer of said composite plating by said metal-coating removing agent.

20. The method of claim 14, wherein said plating step includes providing a composite plating on the entire surface of the lead pin, and wherein said subjecting step includes removing an uppermost metal layer of said composite plating by said metal-coating removing agent.

21. The method of claim 20, wherein said composite plating includes a nickel base layer and a gold uppermost layer deposited on the nickel base layer.

22. The method of claim 14, further comprising the step of subjecting the lead pin to vibration while keeping the second part of the plated surface of the lead pin being subjected to said metal-coating removing agent.

23. The method as recited in claim 3, wherein the paper-mache is made by kneading a mixture of an aqueous solution of synthetic adhesive paste having high viscosity and pulp.

24. The method as recited in claim 23, wherein the paste is selected from polyvinyl alcohol and carboxymethyl cellulose.

25. A method for providing a partial plating to a plurality of lead pins, comprising the steps of:

plating an entire surface of each of the plurality of the lead pins;

covering a first part of a plated surface of the plurality of lead pins by a gelatinous material;

subjecting a second part of the plated surface of each lead pin, which extends out of said gelatinous material to a metal-coating removing agent, to remove a metal coating of the second part of the plated surface; and forming a bulging portion at one end region of the plated surface of the lead pin, wherein said bulging portion is supported during said subjecting step to embed the first part into said gelatinous material.

26. The method of claim 25, wherein said bulging portion is formed of a solder ball.

27. The method of claim 25, adapted to simultaneously provide partial platings to a plurality of lead pins, and further comprising the step of providing a support plate including plural through holes for respectively receiving said plurality of lead pins, said bulging portion of each of said lead pins is supported on an edge of said support plate defining each of said through holes.

28. The method of claim 27, wherein said support plate is treated with a water-repellent finishing, and wherein said subjecting step includes removing said metal coating of said second part of each of said lead pins located between said support plate and said gelatinous material.

29. The method of claim 28, wherein said water-repellant finishing comprises a nickel plating containing polytetrafluoroethylene particles.

30. A method for providing a partial plating of a plurality of articles, comprising the steps of:

plating an entire surface of each of the plurality of articles;

covering a first part of a plated surface of the plurality of articles by a gelatinous material; and subjecting a second part of the plated surface of the plurality of articles, which is not covered by said gelatinous material, to a metal-coating removing agent, to remove a metal coating of the second part of the plated surface, wherein said gelatinous material is formed from paper-mache.

31. A method for providing a partial plating to an articles, comprising the steps of:

plating an entire surface of the article;

covering a first part of a plated surface of the article by a gelatinous material; and subjecting a second part of the plated surface of the article, which extends out of said gelatinous material, to a metal-coating removing agent, to remove a metal coating of the second part of the plated surface, wherein said gelatinous material is formed from paper-mache.

32. The method of claim 31, wherein said plating step includes providing a composite plating on the entire surface of the article, and wherein said subjecting step includes removing an uppermost metal layer of said composite plating by said metal-coating removing agent.

33. The method as recited in claim 30, wherein the paper-mache is made by kneading a mixture of an aqueous soluting of synthetic adhesive paste having high viscosity and pulp.

34. The method as recited in claim 33, wherein the paste is selected from polyvinyl alcohol and carboxymethyl cellulose.

* * * * *

UNITED STATES PATENT AND TRADEMARK OFFICE
CERTIFICATE OF CORRECTION

PATENT NO. : 6,268,017 B1
DATED : July 31, 2001
INVENTOR(S) : Masayuki Takeuchi et al.

Page 1 of 1

It is certified that error appears in the above-identified patent and that said Letters Patent is hereby corrected as shown below:

Column 6,
Line 18, "R.K. Yamato" to -- K. K. Yamato --.

Column 7,
Line 5, change "important" to -- importance --.
Line 54, change "repated" to -- repeated --;
Line 61, after "providing" insert -- a -- and after "partial" insert -- plating --.

Column 8,
Line 14, after "providing" insert -- a --;
Line 61, change "articles" to -- article --;
Line 63, change "articles" to -- article --.

Column 9,
Line 4, change "articles" to -- article --.

Column 10,
Line 42, change "articles" to -- article --;
Line 61, change "soluting" to -- solutions --.

Signed and Sealed this

Twelfth Day of March, 2002

Attest:

Attesting Officer

JAMES E. ROGAN
Director of the United States Patent and Trademark Office